(12) United States Patent
Jeong

(10) Patent No.: US 7,741,212 B2
(45) Date of Patent: *Jun. 22, 2010

(54) SEMICONDUCTOR DEVICE AND METHOD FOR MANUFACTURING THE SAME

(75) Inventor: Eun Soo Jeong, Eumseong-gun (KR)

(73) Assignee: Dongbu Hitek Co., Ltd., Seoul (KR)

( * ) Notice: Subject to any disclaimer, the term of this patent is extended or adjusted under 35 U.S.C. 154(b) by 202 days.

This patent is subject to a terminal disclaimer.

(21) Appl. No.: 11/839,592

(22) Filed: Aug. 16, 2007

(65) Prior Publication Data

US 2008/0048336 A1    Feb. 28, 2008

(30) Foreign Application Priority Data

Aug. 24, 2006   (KR) .................. 10-2006-0080545

(51) Int. Cl.
*H01L 21/4763* (2006.01)
(52) U.S. Cl. ......................... 438/620; 257/774
(58) Field of Classification Search ................ 438/700, 438/620

See application file for complete search history.

(56) References Cited

U.S. PATENT DOCUMENTS 6,171,903 B1 * 1/2001 Chiou ..................... 438/254
6,204,109 B1 * 3/2001 Wu ......................... 438/238
2004/0099925 A1   5/2004 Poveda

FOREIGN PATENT DOCUMENTS

JP    1987-0111826    11/1988
KR    10-1991-0017725    10/1994

* cited by examiner

*Primary Examiner*—Thao X Le
*Assistant Examiner*—Kimberly Trice
(74) *Attorney, Agent, or Firm*—Saliwanchik, Lloyd & Saliwanchik

(57) ABSTRACT

A semiconductor device and method for manufacturing the same are provided, capable of narrowing feature size by utilizing the property of oxidation of a material. In one method, a polysilicon layer can be patterned into a fine pattern up to a critical dimension using a photolithography process. Then the patterned polysilicon layer can be oxidized, thereby narrowing the gap between adjacent polysilicon patterns and narrowing the polysilicon patterns through the oxidation process. The narrowed polysilicon patterns and/or the narrowed gap between adjacent polysilicon patterns can be used to form vias or trenches in the substrate (or layer) below the polysilicon layer having a width narrower than the critical dimension.

6 Claims, 7 Drawing Sheets

SEMICONDUCTOR DEVICE AND METHOD FOR MANUFACTURING THE SAME

CROSS-REFERENCE TO RELATED APPLICATION

The present application claims the benefit under 35 U.S.C. §119 of Korean Patent Application No. 10-2006-0080545, filed Aug. 24, 2006, which is hereby incorporated by reference in its entirety.

BACKGROUND

Recently, as the unit area of a chip gets smaller and a critical dimension is gradually reduced with the high integration of semiconductor devices, the photolithography process realizing patterns on a wafer becomes more and more important.

In general, a photolithography process is performed by first coating a photoresist on a wafer, and then photo-exposing and developing the coated photoresist. After each unit process, a bake process is further performed to increase the hardness of the photoresist on the wafer.

A related art photolithography process, where the photoresist layer is patterned using a light source such as ArF, KrF and $F_2$ excimer laser, has several limitations in implementing a fine pattern such as a gate.

In addition, it may be difficult for the related art photolithography process to realize a linewidth of several nanometers due to a limitation of an optical system and a resolution limit of a photoresist polymer itself.

Furthermore, it may be difficult to apply the related art photolithography process to a method of forming a hole or an interconnection line in a multi-layered structure.

BRIEF SUMMARY

Embodiments provide a semiconductor device and a method for manufacturing the same that can realize a double-layered hole of several nanometers or an interconnection line trench of several nanometers.

Embodiments provide a semiconductor device and method for manufacturing the same capable of narrowing feature size using the property of oxidation of a material. In an embodiment, a hole or trench can have a width which is equal to or less than a critical dimension obtainable by the related art photography process implementing a fine pattern.

In one embodiment, a semiconductor device includes: a first trench formed on a substrate, the first trench having a width equal to or less than half a predetermined critical dimension; and a second trench formed on the substrate, the second trench having a width equal to or less than half the predetermined critical dimension, wherein the first trench and the second trench are formed to different depths on the substrate.

In another embodiment, a method for manufacturing a semiconductor device, includes: forming a layer of a material that is capable of oxidizing on a substrate; etching the material layer to form a first trench having a critical dimension, where the substrate is not exposed through the etched material layer; oxidizing the material layer having the first trench formed therein, thereby forming a second trench having a width narrower than the first trench; planarizing the oxidized material layer to expose remaining non-oxidized material layer; removing the non-oxidized material layer to expose the substrate; and etching the exposed substrate to form a third trench having a width which is equal to or less than half the critical dimension. In one embodiment, the material capable of oxidizing can be a polysilicon layer.

In further another embodiment, a method for manufacturing a semiconductor device, includes: forming a layer of a material that is capable of oxidizing on a substrate; etching the material layer to form a first trench having a critical dimension, where the substrate is exposed through the etched material layer; oxidizing the material layer having the first trench formed therein, thereby forming a second trench having a width narrower than the first trench; and etching the substrate exposed through the second trench to form a third trench having a width which is equal to or less than half the critical dimension.

The details of one or more embodiments are set forth in the accompanying drawings and the description below. Other features will be apparent from the description and drawings, and from the claims.

DETAILED DESCRIPTION

Hereinafter, a semiconductor device and a method for manufacturing the same according to embodiments of the present invention will now be illustrated with reference to the accompanying drawings.

In the description of embodiments, it will be understood that when a layer (or film) is referred to as being 'on' another layer or substrate, it can be directly on the another layer or substrate, or intervening layers may also be present. Further, it will be understood that when a layer is referred to as being 'under' another layer, it can be directly under the another layer, and one or more intervening layers may also be present. In addition, it will also be understood that when a layer is referred to as being 'between' two layers, it can be the only layer between the two layers, or one or more intervening layers may also be present.

FIGS. 1 to 9 are cross-sectional views illustrating a method for manufacturing a semiconductor device according to a first embodiment.

The first embodiment relates to a method for manufacturing a semiconductor device including a gate insulating layer with an ultrafine pattern of which the width is equal to or less than half a critical dimension which can be obtained using a particular optical system.

Of course, a metal line including a contact hole having the ultrafine width can be formed using technical features of this embodiment.

Figure 1:
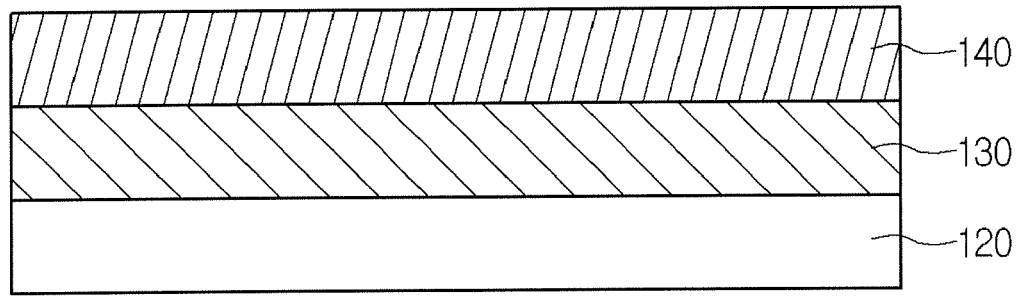
FIGS. 1 to 9 are cross-sectional views illustrating a method for manufacturing a semiconductor device according to an embodiment.

Referring to FIG. 1, a polysilicon layer 130 is formed on a substrate (or a base) 120. A photoresist layer 140 is formed on the polysilicon layer 130. According to various embodiments, the polysilicon layer 130 and photoresist layer 140 can be provided in a process to form, for example, semiconductor components or a lower metal line or the like on the substrate (or layer) 120.

Figure 2:
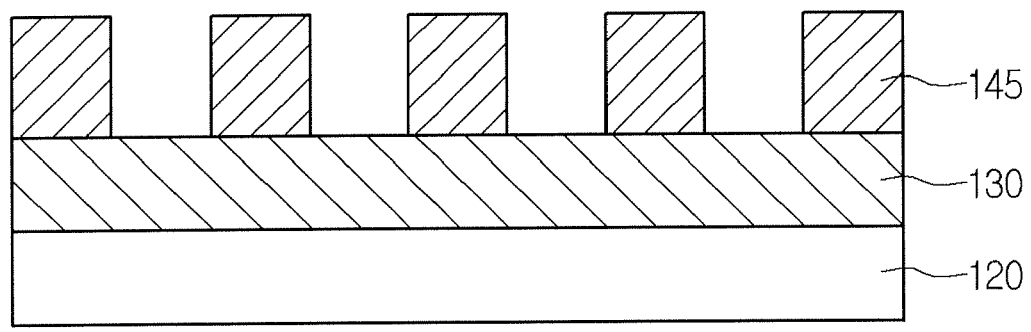

Referring to FIG. 2, the photoresist layer 140 formed on the polysilicon layer 130 is patterned into a predetermined shape, thereby forming a photoresist pattern 145. The photoresist pattern can vary in shape according to desired patterns for a particular layer. A space between the photoresist patterns 145 can be the critical dimension that can be obtained by using a related art optical system.

Figure 3:
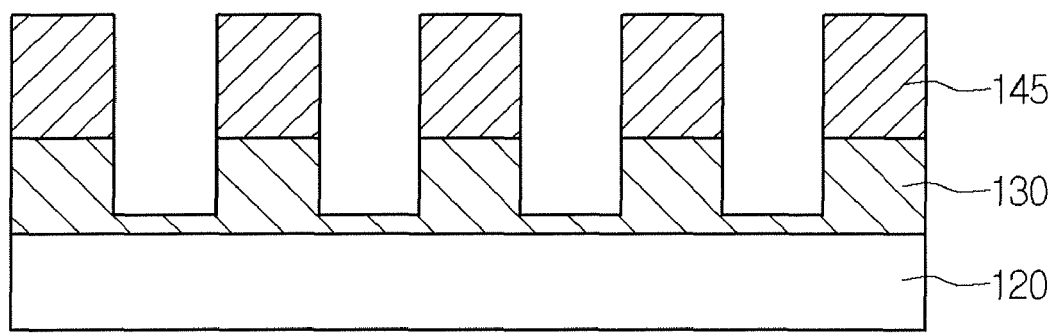

Afterwards, referring to FIG. 3, the polysilicon layer 130 is etched to form first trenches using the photoresist pattern 145 as an etch mask. According to an embodiment, the substrate is not exposed during the etching of the polysilicon layer in order to provide a remaining polysilicon layer 130 between the photoresist patterns 145 that can be oxidized during a later performed oxidation process of the polysilicon layer 130.

Subsequently, referring to FIG. 4, the polysilicon layer 130 with the first trenches having the width of the spacing between photoresist patterns 145 formed therein is oxidized to form a second trench between oxide layers 150. The second trench is formed by the narrowing of the first trench caused by oxidation of the polysilicon layer. In one embodiment, the second trench can have a width equal to or less than half the critical dimension. Of the total thickness of the oxide layer 150 formed during the oxidation of the polysilicon layer 130, approximately 45% of the total thickness corresponds to the thickness of a portion of the oxide layer 150 grown inwardly based on a boundary between the polysilicon layer 130 and air, whereas approximately 55% of the total thickness corresponds to the thickness of another portion of the oxide layer 150 grown outwardly based on the boundary.

Figure 4:
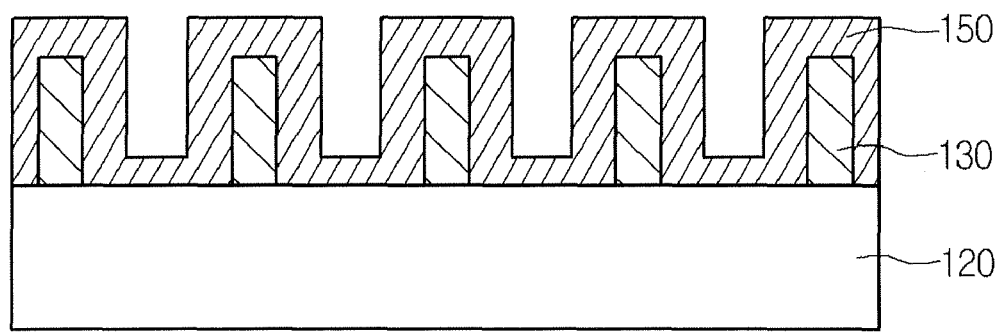

Therefore, the etched polysilicon layer 130 of FIG. 3 is oxidized as illustrated in FIG. 4, so that the portion of polysilicon layer 130, which is not oxidized, exists inside, and the oxide layer 150 (hereinafter, referred to as polysilicon oxide layer) is formed outside the polysilicon layer 130. The more the material, in this case polysilicon 130, is oxidized, the narrower the peaks of non-oxidized material. In one embodiment, the polysilicon layer 130 can be oxidized to ½ its original size. In a further embodiment, the polysilicon layer 130 can be oxidized to, for example, ¼ its original size.

Figure 5:
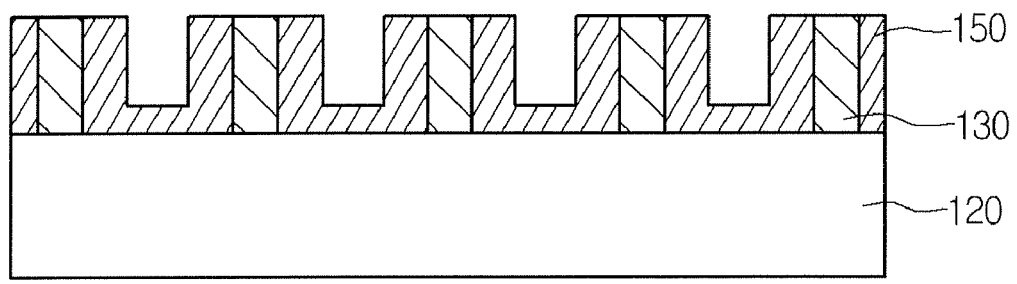

Next, referring to FIG. 5, the polysilicon oxide layer 150 on the polysilicon layer 130 is planarized so as to expose the polysilicon layer 130. The planarization can be performed using a chemical mechanical polishing (CMP) process or the like.

Figure 6:
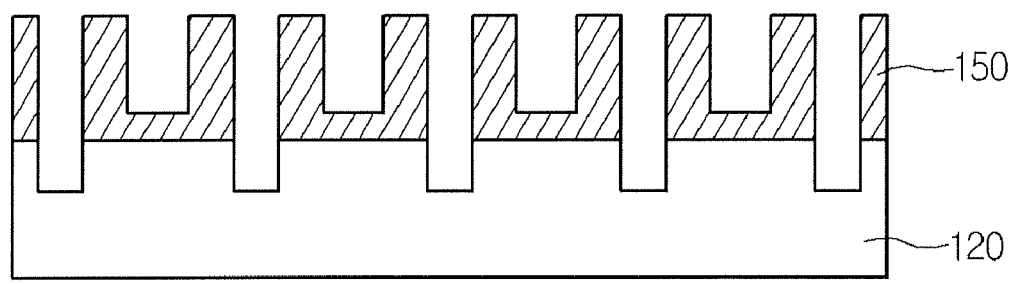

Thereafter, referring to FIG. 6, the exposed polysilicon layer 130 is removed to expose the substrate 120. Then, the exposed substrate 120 is etched using the polysilicon oxide layer 150 as an etch mask to form a third trench having the width of the removed narrowed polysilicon layer 130.

In one embodiment, the etching of the exposed polysilicon layer 130 can be performed using a fluorinated ethylene propylene (FEP) deep etching process.

Figure 7:
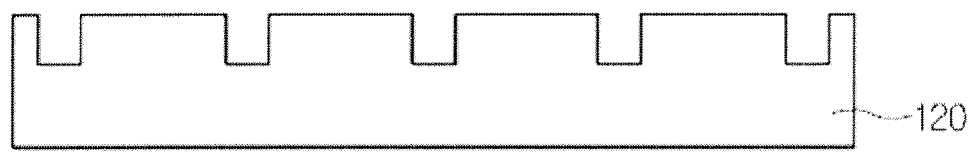

Afterwards, referring to FIG. 7, the polysilicon oxide layer 150 is removed from the substrate 120 having the third trench formed therein.

As a result, according to the first embodiment, it is possible to form a trench having a width that is equal to or less than half the critical dimension that can be realized by the related art photography process implementing a fine pattern.

Such an ultrafine trench formed by the first embodiment can be used, for example, in forming a gate insulating layer for a gate electrode or a metal line.

Figure 8:
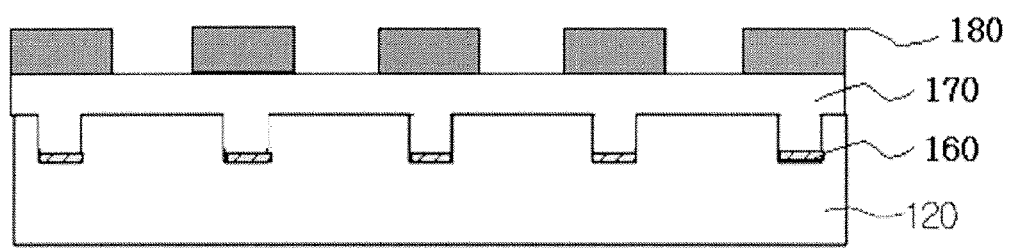
Figure 9:
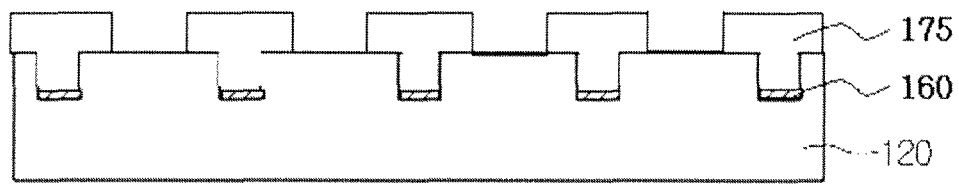

FIGS. 8 and 9 illustrate a case where the ultrafine trench shown in FIG. 7 is used for forming a gate insulating layer for a gate electrode.

Referring to FIG. 8, a gate insulating layer 160 can be formed on a bottom surface of the third trench. The gate insulating layer 160 can be thermally oxidized to form a gate oxide layer.

Next, a gate metal 170 can be formed on an entire surface of the substrate 120 so as to fill the third trench where the gate insulating layer 160 is formed. The gate metal 170 can be formed of polysilicon.

Thereafter, referring to FIG. 9, a photoresist pattern 180 for a gate can be formed on the gate metal 170, and the gate metal 170 is then etched using the photoresist pattern 180 as a mask to thereby form a gate 175 of which an upper portion is wider than a lower portion.

Accordingly, according to the first embodiment, it is possible to form a gate electrode having a gate insulating layer, where the linewidth is equal to or less than half the critical dimension that can be realized by the related art photography process implementing a fine pattern.

In a further embodiment, a silicide (not shown) can be formed on the gate 175. In this case, since the gate 175 is wider than the gate insulating layer 160, the resistance of silicide can be reduced.

In another embodiment, the ultrafine trench can be used as a contact hole (via hole) for a metal line.

As described above, a polysilicon pattern is formed to have a critical dimension that can be realized by the related art photolithography implementing a fine pattern, and the polysilicon pattern is then oxidized. Thereafter, an oxide mask having a linewidth narrower than the linewidth obtainable by the related art photolithography is formed, and can be used to form a deep hole or interconnection line trench. Consequently, it is possible to realize a double-layered hole of several nanometers or an interconnection line trench of several nanometers.

According to an embodiment, the reduction of critical dimension can greatly improve the integration degree of the semiconductor device.

Figure 10:
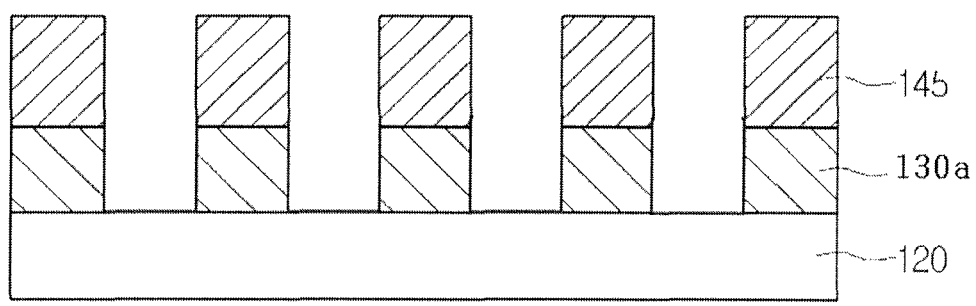
FIGS. 10 to 12 are cross-sectional views illustrating a method for manufacturing a semiconductor device according to an embodiment.
Figure 11:
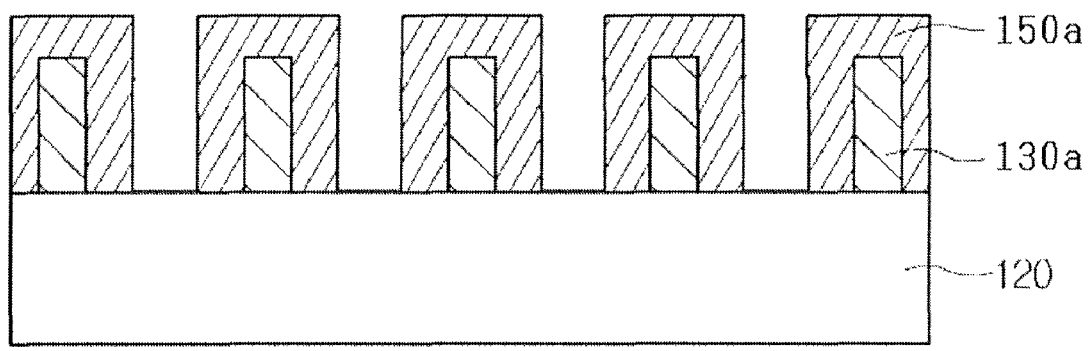
Figure 12:
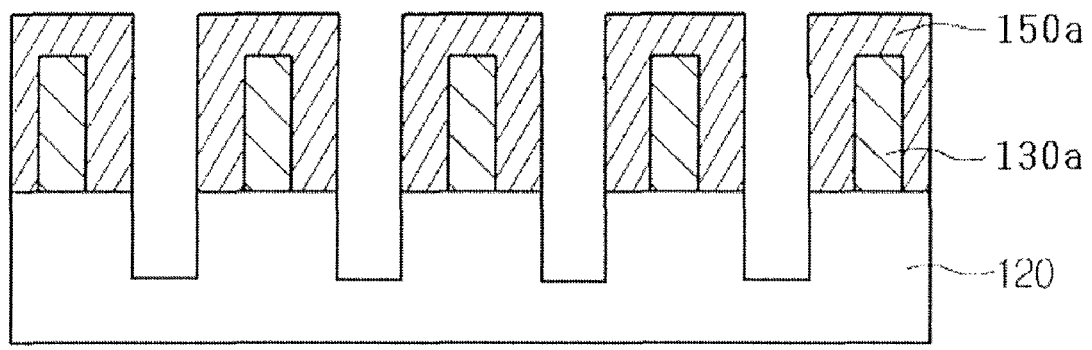

FIGS. 10 to 12 are cross-sectional views illustrating a method for manufacturing a semiconductor device according to a second embodiment.

The second embodiment may employ the technical features of the first embodiment.

However, the second embodiment is different from the first embodiment in that the substrate 120 is exposed when the polysilicon layer 130a is etched.

For instance, the polysilicon layer 130a can be etched so as to expose the substrate 120 using the photoresist pattern 145 as an etch mask, as illustrated in FIG. 10.

Thereafter, referring to FIG. 11, the polysilicon layer 130a is oxidized to form a polysilicon oxide 150a, thereby forming a second trench having a width that is equal to or less than half the critical dimension obtainable by the related art photolithography.

Afterwards, referring to FIG. 12, the substrate 120 exposed by the second trench is etched to form a third trench using the polysilicon oxide 150a as an etch mask. The third trench can be used as, for example, a trench for forming a gate electrode as described with reference to FIGS. 8 and 9.

Figure 13:
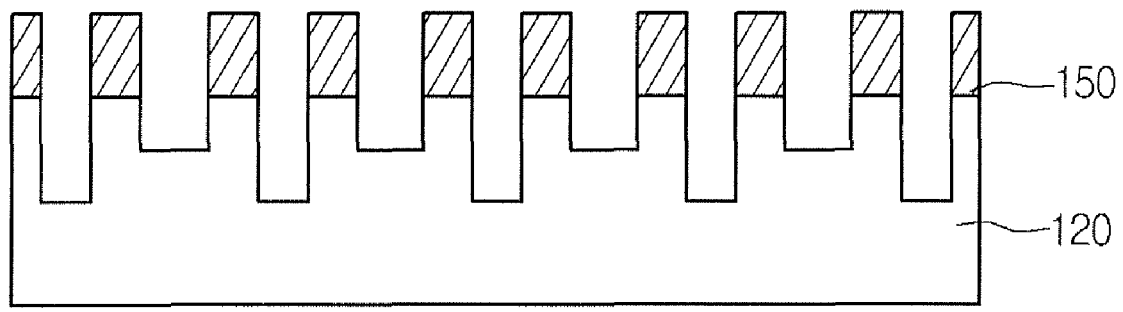
FIGS. 13 and 14 are cross-sectional views illustrating a method for manufacturing a semiconductor device according to an embodiment.
Figure 14:
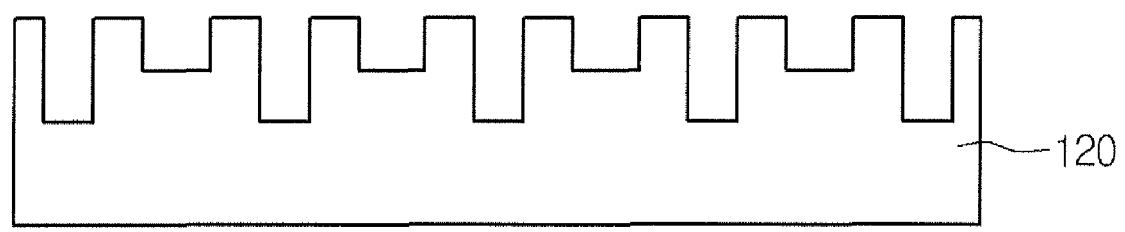

FIGS. 13 and 14 are cross-sectional views illustrating a method for manufacturing a semiconductor device according to a third embodiment.

After removing the exposed polysilicon layer 130 to expose the substrate 120 as illustrated in FIG. 6, the method according to the third embodiment further includes over-etching the second trench of the polysilicon oxide 150 and the exposed substrate 120, thereby forming a plurality of trenches having different heights.

For instance, referring to FIG. 13, the second trench of the polysilicon oxide 150 and the exposed substrate 120 can be over-etched to form the plurality of trenches having different heights.

In the third embodiment, the plurality of trenches can include second spaces of which widths are equal to or less than half the critical dimension obtainable by the related art photolithography. Herein, the second spaces are different from first spaces in height.

For example, the second spaces can be formed lower than the first spaces, or the second spaces can be formed higher than the first spaces.

Thus, it is possible to form a semiconductor device having a stepped trench with a width that is equal to or less than half the critical dimension obtainable by the related art optical system.

The stepped trench according to the third embodiment can be used, for example, for a contact hole (via hole) of a metal line and a gate insulating layer for forming a gate electrode.

Although the oxidized material is described above in the embodiments as polysilicon, the embodiments are not limited thereto. Any suitable oxidizing material can be used. For example, Titanium (Ti)—forming $TiO_2$—instead of polysilicon can be used. In other embodiments, if the base being etched to form the narrow trenches or holes is a metal layer, a mask layer of a material that oxidizes can be used incorporating similar techniques to forming the trenches or holes in a substrate as described above.

The reduction of critical dimension can greatly improve the integration degree of the semiconductor device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skill in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device, the method comprising:
    forming a layer of a material capable of oxidizing on a substrate;
    etching the layer to form a first trench having a critical dimension, wherein a portion of the layer remains below the first trench;
    oxidizing the layer having the first trench formed therein, thereby narrowing the first trench to form a second trench having a width equal to or less than half the critical dimension;
    planarizing the oxidized layer so as to expose remaining non-oxidized material;
    removing the exposed remaining non-oxidized layer material to expose the substrate;
    etching the exposed substrate to form a third trench having a width equal to or less than half the critical dimension; and
    removing the oxidized layer from the substrate having the third trench formed therein.

2. The method according to claim 1, further comprising, a tier removing the exposed remaining non-oxidized layer material to expose the substrate, over-etching the second trench and the exposed substrate to form a plurality of trenches having different depths.

3. The method according to claim 1, further comprising, after removing the oxidized layer;
    forming a gate insulating layer on a bottom surface of the third trench; and
    forming a gate electrode on the gate insulating layer.

4. The method according to claim 1, further comprising, after removing the oxidized layer:
    depositing a metal on an entire surface of the substrate so as to fill the third trench; and
    removing the metal to form a metal line by planarization and/or etching the metal.

5. The method according to claim 1, wherein the layer material comprises polysilicon.

6. The method according to claim 5, wherein removing the exposed remaining non-oxidized layer material comprises performing a fluorinated ethylene propylene (FEP) deep etching on the exposed polysilicon layer.

* * * * *